United States Patent
Kinouchi et al.

(10) Patent No.: US 8,985,175 B2
(45) Date of Patent: Mar. 24, 2015

(54) ROOM TEMPERATURE BONDING MACHINE AND ROOM TEMPERATURE BONDING METHOD

(75) Inventors: Masato Kinouchi, Yokohama (JP); Takayuki Goto, Yokohama (JP); Satoshi Tawara, Yokohama (JP); Takeshi Tsuno, Yokohama (JP); Jun Utsumi, Yokohama (JP); Kensuke Ide, Ritto (JP); Takenori Suzuki, Ritto (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 568 days.

(21) Appl. No.: 12/811,177

(22) PCT Filed: Sep. 29, 2008

(86) PCT No.: PCT/JP2008/067676
§ 371 (c)(1),
(2), (4) Date: Dec. 2, 2010

(87) PCT Pub. No.: WO2009/087796
PCT Pub. Date: Jul. 16, 2009

(65) Prior Publication Data
US 2011/0083801 A1 Apr. 14, 2011

(30) Foreign Application Priority Data

Jan. 9, 2008 (JP) .................... 2008-002102

(51) Int. Cl.
*B32B 37/10* (2006.01)
*B23K 20/02* (2006.01)

(52) U.S. Cl.
CPC ......... *B32B 37/1009* (2013.01); *B32B 2309/68* (2013.01); *B32B 37/10* (2013.01); *B23K 20/02* (2013.01)
USPC ........................................... 156/385

(58) Field of Classification Search
CPC .. B32B 2309/68; B32B 37/10; B32B 37/1009
USPC .......................... 156/285, 286, 381, 382, 356
See application file for complete search history.

(56) References Cited

U.S. PATENT DOCUMENTS

| | | |
|---|---|---|
| 4,726,988 A | 2/1988 | Oka et al. |
| 5,803,107 A | 9/1998 | Kaveh et al. |

(Continued)

FOREIGN PATENT DOCUMENTS

| | | |
|---|---|---|
| CN | 1465096 A | 12/2003 |
| CN | 1586003 A | 2/2005 |

(Continued)

OTHER PUBLICATIONS

Machine Translation of JP 2006-339363.*

(Continued)

*Primary Examiner* — Christopher Schatz
(74) *Attorney, Agent, or Firm* — Birch, Stewart, Kolasch & Birch, LLP

(57) ABSTRACT

A room temperature bonding machine is provided with an evacuation apparatus, a gas supply apparatus, a pressure gauge, a cleaner apparatus, a pressure controller and a pressing mechanism. The evacuation apparatus evacuates gas from the chamber. The gas supply apparatus supplies introduction gas into the chamber. The pressure gauge measures the pressure in the chamber. The cleaner apparatus cleans first and second substrates in the chamber when said pressure is at a predetermined degree of vacuum. The pressure controller controls both of the evacuation apparatus and the gas supply apparatus so that the pressure is regulated to a target pressure. The pressing mechanism presses and bonds the first and second substrates when the pressure is set to said target pressure.

4 Claims, 6 Drawing Sheets

(56) References Cited

U.S. PATENT DOCUMENTS

| | | | |
|---|---|---|---|
| 5,897,923 A * | 4/1999 | Tamura et al. | 427/571 |
| 7,582,885 B2 | 9/2009 | Katagiri et al. | |
| 2003/0159817 A1 | 8/2003 | Azuma | |
| 2003/0168145 A1 | 9/2003 | Suga et al. | |
| 2003/0178134 A1 | 9/2003 | Muramoto et al. | |
| 2005/0183789 A1 | 8/2005 | Hong | |
| 2007/0051462 A1* | 3/2007 | Nakayama et al. | 156/285 |
| 2007/0105459 A1 | 5/2007 | Aruga et al. | |
| 2007/0110917 A1 | 5/2007 | Okada | |
| 2007/0218664 A1 | 9/2007 | Ito et al. | |

FOREIGN PATENT DOCUMENTS

| | | |
|---|---|---|
| CN | 1708739 A | 12/2005 |
| CN | 1885490 A | 12/2006 |
| CN | 1936678 A | 3/2007 |
| CN | 101042992 A | 9/2007 |
| CN | 101043001 A | 9/2007 |
| JP | 60-25232 A | 2/1985 |
| JP | 61-140390 A | 6/1986 |
| JP | 61-272375 A | 12/1986 |
| JP | 6-76782 A | 3/1994 |
| JP | 7-72340 A | 3/1995 |
| JP | 9-158833 A | 6/1997 |
| JP | 2002-64042 A | 2/2002 |
| JP | 2002-91573 A | 3/2002 |
| JP | 2003-318219 A | 11/2003 |
| JP | 2005-26608 A | 1/2005 |
| JP | 2005-229006 A | 8/2005 |
| JP | 2005-294800 A | 10/2005 |
| JP | 2005-294824 A | 10/2005 |
| JP | 2006-134900 A | 5/2006 |
| JP | 2006-294481 A | 10/2006 |
| JP | 2006-339363 A | 12/2006 |
| JP | 2007-47910 A | 2/2007 |
| JP | 2007-518221 A | 7/2007 |
| JP | 2007-266058 A | 10/2007 |
| JP | 2008-501222 A | 1/2008 |
| TW | 228183 B | 2/2005 |
| WO | WO 2004/042487 A1 | 5/2004 |
| WO | WO 2005/059942 A2 | 6/2005 |
| WO | WO 2010/018621 A1 | 2/2010 |

OTHER PUBLICATIONS

Office Action from corresponding Chinese Application No. 200880123613.7 mailed Aug. 30, 2012 with English translation.

Canadian Office Action issued in Canadian Patent Application No. 2,711,227 on Mar. 27, 2013.

Matsuzawa, Y. et al., "Room-temperature Interconnection of Electroplated Au Microbump by Means of Surface Activated Bonding Method", 2001 Electronic Components and Technology Conference, 2001.

Taiwanese Office Action issued in Taiwanese Patent Application No. 097138599 on Apr. 29, 2013.

Decision to Grant a Patent issued in corresponding Taiwanese Application No. 097138599 on Jan. 16, 2014.

* cited by examiner

ROOM TEMPERATURE BONDING MACHINE AND ROOM TEMPERATURE BONDING METHOD

BACKGROUND OF THE INVENTION

1. Field of the Invention

The present invention relates to a room temperature bonding machine and a room temperature bonding method, and more particularly to a room temperature bonding machine and a room temperature bonding method, which are used when a room temperature bonding is carried out with control of the pressure in the chamber.

2. Description of the Related Art

MEMSs (Micro Electro Mechanical Systems), within which micro-sized electric and mechanical components are integrated, are known in the art. Examples of the MEMS include a micro machine, a pressure sensor, and a super small motor. The MEMS is formed so that a vibration structure, exemplified as a cantilever, is sealed therein. The MEMS is desired to be manufactured so that the vibration attenuation ratio of the vibration structure is variable. It is known in the art that the vibration attenuation ratio of a vibration structure varies in accordance with the pressure of gas filled in the atmosphere in which the vibration structure is sealed. That pressure is approximately identical to the pressure of the atmosphere when a substrate is bonded to an MEMS by room temperature bonding. It is thus desired that the pressure in the chamber which provides an atmosphere in which the room temperature bonding is implemented is controlled in a wider range, more precisely.

Japanese Patent Application Publication No. P2006-134900 A discloses a bonding method that can easily attain the room temperature bonding by surely placing junctions into clean states suitable for bonding before performing bonding. The bonding method is related to bonding material bodies having junctions on the surfaces thereof and involves bonding the junctions after the surfaces of the junctions are cleaned by energy wave under a decompressed pressure, wherein, after the cleaning is executed at a predetermined degree of vacuum suitable for the cleaning, the junctions are bonded to each other with the degree of vacuum further increased.

Japanese Patent Application Publication No. H09-158833 A discloses a vacuum evacuation apparatus that can generate a pressure of $10^{-4}$ Pa or less in a vacuum vessel and can adjust the pressure in a wide range between $10^{-5}$ Pa and $10^{-2}$ Pa and can further measure the pressure in the vacuum vessel and can control the pressure precisely. The vacuum evacuation apparatus is provided with: a vacuum vessel accommodating a sample therein; a first vacuum pump connected through a sluice valve to the vacuum vessel to evacuate the vacuum vessel; a mass flow controller introducing gas from a gas supply source into the vacuum vessel; an intermediate room located between the mass flow controller and the vacuum vessel and evacuated by a second vacuum pump provided separately from the first vacuum pump; and a first variable conductance valve having a controllable conductance and located between the vacuum vessel and the middle room.

Japanese Patent Application Publication No. S60-025232 A discloses a semiconductor manufacture apparatus that can reduce a pressure adjustment time to improve the throughput by adjusting the pressure in a vacuum room without opening/closing operations of a variable conductance valve. The semiconductor manufacture apparatus is provided with: a vacuum room in which a wafer is processed; evacuation means for evacuating the vacuum room; and gas supply means for supplying gas necessary for the processing of the wafer to the vacuum room, and in this semiconductor manufacture apparatus, the evacuation of the vacuum room is steadily performed by the exhausting means, and the gas flow supplied to the vacuum room from the gas supply means is controlled, thereby adjusting the pressure in the vacuum room.

Japanese Patent Application Publication No. P 2007-47910 A discloses a pressure and flow control system which is compact and economically advantageous, in which system a circuit group, such as a control circuit, an amplifying circuit are shared. The pressure and flow control system is provided with a sensor that can measure the pressure and the flow rate; means for controlling the pressure and the flow rate; and means for displaying the values of the pressure and the flow rate.

SUMMARY OF INVENTION

An objective of the present invention is to provide a room temperature bonding machine and a room temperature bonding method, which control the pressure in a chamber more precisely.

Another objective of the present invention is to provide a room temperature bonding machine and a room temperature bonding method, which control the pressure in a chamber so that the pressure is more stable.

Still another objective of the present invention is to provide a room temperature bonding machine and a room temperature bonding method, in which the controllable range of the pressure is wider.

Still another objective of the present invention is to provide a room temperature bonding machine and a room temperature bonding method, which control the pressure in a chamber more precisely at a higher speed.

Still another objective of the present invention is to provide a room temperature bonding machine and a room temperature bonding method, which control the pressure of an atmosphere sealed by the room temperature bonding, more precisely.

Still another objective of the present invention is to provide a room temperature bonding machine and a room temperature bonding method, in which the room temperature bonding is implemented more surely and the pressure of the atmosphere sealed by the room temperature bonding is controlled more precisely.

A room temperature bonding machine is provided with an evacuation apparatus, a gas supply apparatus, a pressure gauge, a cleaner apparatus, a pressure controller and a pressing mechanism. The evacuation apparatus evacuates gas from the chamber. The gas supply apparatus supplies introduction gas into the chamber. The pressure gauge measures the pressure in the chamber. The cleaner apparatus cleans first and second substrates in the chamber when said pressure is at a predetermined degree of vacuum. The pressure controller controls both of the evacuation apparatus and the gas supply apparatus so that the pressure is regulated to a target pressure. The pressing mechanism presses and bonds the first and second substrates when the pressure is set to said target pressure. In this case, the room temperature bonding machine can control the pressure in the chamber over a wider range more precisely, as compared with a method of controlling only one of the gas supply apparatus and the evacuation apparatus. As a result, the pressure of the atmosphere sealed by the room temperature bonding can be controlled more precisely.

The pressure controller controls an evacuation speed at which the evacuation apparatus evacuates the gas from the chamber, on the basis of the target pressure, and controls a supply flow rate at which the gas supply apparatus supply the introduction gas into the chamber, based on the pressure, so that the pressure is regulated to the target pressure. In this case, the room temperature bonding machine can control the pressure in the chamber at a higher speed, so that the pressure in the chamber is more stable, as compared with the control of the evacuation apparatus.

The evacuation apparatus preferably includes a valve for changing the opening of a flow path which provides a communication between the interior space of the chamber and a vacuum pump. In this case, the pressure controller controls the evacuation speed by controlling the opening.

The evacuation apparatus preferably includes a plurality of valves which open and close respective flow paths which provides parallel communications between the interior space of the chamber and the vacuum pump. In this case, the pressure controller controls the evacuation speed by controlling the opening and closing of the plurality of valves.

The gas supply apparatus preferably includes a flow adjustment valve for changing the flow rate of the gas that flows through a supply-side flow path which provides a communication between an introduction gas supply source and the interior space of the chamber. In this case, the pressure controller controls the supply flow rate by controlling the flow adjustment valve.

The gas supply apparatus preferably includes: a first flow adjustment valve for changing the flow rate of the gas that flows through a first supply-side flow path which provides a communication between the introduction gas supply source and the interior space of the chamber; and a second flow adjustment valve for changing the flow rate of the gas that flows through a second supply-side flow path which provides a communication between the introduction gas supply source and the interior space of the chamber. In this case, the pressure controller controls the supply flow rate by controlling both of the first and second flow adjustment valves.

The room temperature bonding machine according to the present invention further includes a roughing vacuum apparatus for evacuating the gas from the chamber. In the room temperature bonding machine according to the present invention, the evacuation can be carried out by using the roughing vacuum apparatus so that the pressure in the chamber can be controlled at the higher speed, when the pressure in the chamber is the pressure that prohibits the evacuation of the evacuation apparatus.

The room temperature bonding method according to the present invention includes steps of: measuring a pressure in a chamber; cleaning first and second substrates in the chamber when the pressure is at a predetermined degree of vacuum; controlling an evacuation apparatus which evacuates gas from the chamber, based on a target pressure; controlling a gas supply apparatus which supplies introduction gas into the chamber so that the pressure is regulated to the target pressure, on the basis of the pressure; and bonding substrates by room temperature bonding in the chamber, when the pressure is set to said target pressure. As compared with a method of controlling only one of the gas supply apparatus and the evacuation apparatus, the room temperature bonding method can control the pressure in the chamber more precisely over a wider range so that the pressure is the chamber is more stable, and can control the pressure of the atmosphere sealed by the room temperature bonding, more precisely.

An operation for controlling the supply flow rate is implemented when the evacuation speed at which the gas is evacuated from the chamber is constant. As compared with a control for changing the evacuation speed on the basis of the measured pressure, the room temperature bonding method can control the pressure in the chamber at the higher speed so that the pressure in the chamber is more stable.

The gas supply apparatus includes: a first flow rate adjustment valve controlling a first flow rate of gas flowing through a first supply-side flow path providing a communication between an introduction gas supply source and the interior space of the chamber; and a second flow rate adjustment valve controlling a second flow rate of gas flowing through a second supply-side flow path providing a communication between the introduction gas supply source and the interior space of the chamber, more precisely than the first flow rate adjustment valve. In this case, in the gas supply apparatus, the second flow rate adjustment valve is controlled based on the pressure in a state the first supply-side flow path is closed by using the first flow rate valve, when the target pressure is lower than a predetermined pressure, and the first flow rate adjustment valve is controlled based on the pressure in a state the second supply-side flow path is closed by using the second flow rate valve, when the target pressure is higher than the predetermined pressure. Such control allows controlling the pressure in the chamber more precisely.

The gas supply apparatus is controlled to stop supply of the introduction gas in a state in which gas is not evacuated from the chamber by using the evacuation apparatus, at a timing when the pressure is set to the target pressure, in a case when the target pressure is higher than a predetermined pressure (for example, an allowed maximum pressure of the evacuation apparatus).

The gas supply apparatus includes: a first flow rate adjustment valve controlling a first flow rate of gas flowing through a first supply-side flow path providing a communication between an introduction gas supply source and the interior space of the chamber; and a second flow rate adjustment valve controlling a second flow rate of gas flowing through a second supply-side flow path providing a communication between the introduction gas supply source and the interior space of the chamber, more precisely than the first flow rate adjustment valve. In this case, the gas supply apparatus is controlled so that the second supply-side flow path is closed by using the second flow rate adjustment valve after the first supply-side flow path is closed by using the first flow rate adjustment valve. Such control allows controlling the pressure in the chamber to the target pressure precisely at a high speed.

The room temperature bonding method according to the present invention preferably further includes a step of: evacuating gas from the chamber by using a roughing vacuum apparatus prepared separately from the evacuation apparatus, when the pressure is higher than an allowed maximum pressure of the evacuation apparatus. In this case, the evacuation apparatus evacuates gas from the chamber after the pressure is reduced below the allowed maximum pressure. Such room temperature bonding method allows controlling the pressure in the chamber over a wide range, independently of the allowed maximum pressure.

The step of controlling said gas supply apparatus is preferably implemented simultaneously with an operation of positioning said first and second substrates after cleaning of said first and second substrates. Such room temperature bonding method allows shortening a time duration from the cleaning of the substrates to the room temperature bonding of the substrates, and accordingly, the substrates can be bonded by room temperature bonding more surely, and the pressure of the atmosphere sealed by the room temperature bonding can be controlled more precisely.

DETAILED DESCRIPTION OF THE INVENTION

Figure 1:
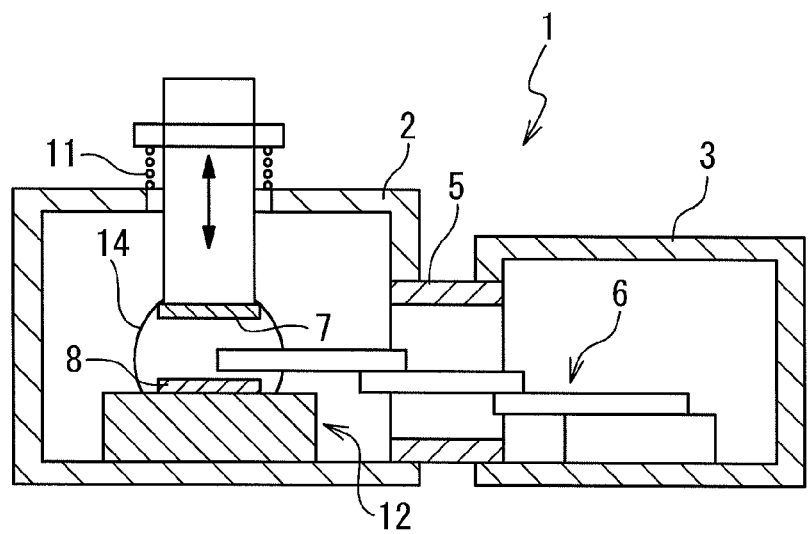
FIG. 1 is a sectional view showing an embodiment of a room temperature bonding machine according to the present invention.

Embodiments of a room temperature bonding machine according to the present invention will be described below with reference to the drawings. The room temperature bonding machine 1 is provided with a bonding chamber 2 and a load lock chamber 3, as shown in FIG. 1. The bonding chamber 2 and the load lock chamber 3 are vessels which seal the interior spaces thereof from the external environment. The room temperature bonding machine 1 further includes a gate valve 5. The gate valve 5 is placed between the bonding chamber 2 and the load lock chamber 3 and designed to close and open a gate which provides a communication between the interior space of the bonding chamber 2 and the interior space of the load lock chamber 3.

The load lock chamber 3 is provided with a cover and a vacuum pump, which are not shown. The cover closes and opens a gate which provides a communication between the exterior and interior of the load lock chamber 3. The vacuum pump evacuates gas from the load lock chamber 3. Examples of the vacuum pump include a turbo molecular pump, a cryopump and an oil diffusion pump.

The load lock chamber 3 further includes a carrying mechanism 6 therein. The carrying mechanism 6 is used to transport a substrate placed in the load lock chamber 3 to the bonding chamber 2 through the gate valve 5 and to transport a substrate placed in the bonding chamber 2 to the interior space of the load lock chamber 3 through the gate valve 5.

The bonding chamber 2 is provided with an upper stage 7, a lower stage 8, a pressing mechanism 11 and a positioning mechanism 12. The lower stage 8 is disposed in the bonding chamber 2 and supported in the bonding chamber 2 so as to be adapted to parallel displacement in the horizontal direction and rotational motion about a rotation axis parallel to the vertical direction. The positioning mechanism 12 drives the lower stage 8 so that the substrate supported by the lower stage 8 moves in parallel in the horizontal direction and rotates about the rotation axis parallel to the vertical direction. The upper stage 7 is disposed in the bonding chamber 2 and supported by the bonding chamber 2 so as to be adapted to parallel displacement in the vertical direction. The upper stage 7 has a dielectric layer at the lower end and applies a voltage between the dielectric layer and a substrate to attract the substrate onto the dielectric layer by an electrostatic force. The pressing mechanism 11 drives the upper stage 7 so that the substrate supported by the upper stage 7 moves in parallel in the vertical direction.

The bonding chamber 2 further includes an ion gun 14. The ion gun 14 emits accelerated argon ions. The ion gun 14 is oriented to the space between the substrate supported by the upper stage 7 and the substrate supported by the lower stage 8 toward the inner surface of the bonding chamber 2 in a state in which the substrate supported by the upper stage 7 and the substrate supported by the lower stage 8 are positioned apart from each other. That is, the emission direction of the ion gun 14 passes between the substrate supported by the upper stage 7 and the substrate supported by the lower stage 8 and intersects the inner surface of the bonding chamber 2. It should be noted that the ion gun 14 may be replaced with another cleaning apparatus for cleaning the substrate surfaces. Examples of the cleaning apparatus include a plasma gun and a high-speed atom beam source.

Figure 2:
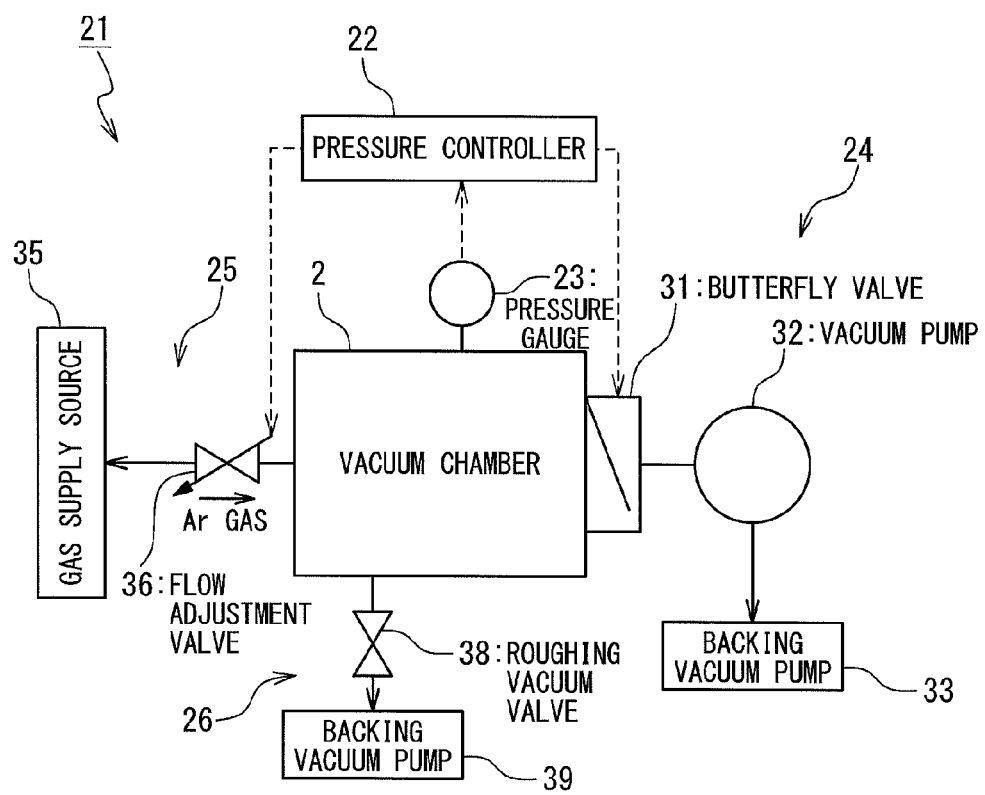
FIG. 2 is a circuit diagram showing a pressure control apparatus.

The room temperature bonding machine 1 further includes a pressure control apparatus. The pressure control apparatus 21 is provided with a pressure controller 22, a pressure gauge 23, an evacuation apparatus 24, an introduction gas supply apparatus 25 and a roughing vacuum apparatus 26, as shown in FIG. 2.

The pressure controller 22 is a computer and provided with a CPU, a storage device and an input device, which are not shown. The CPU executes computer programs installed in the pressure controller 22 to control the storage device, the input device, the pressure gauge 23, the evacuation apparatus 24, the introduction gas supply apparatus 25 and the roughing vacuum apparatus 26. The storage device records the computer programs and transiently records data generated by the CPU. The input device generates data in response to operations by a user and outputs the generated data to the CPU. An example of the input device is a keyboard.

The pressure gauge 23 measures the pressure in the bonding chamber 2 and outputs the measured pressure to the pressure controller 22.

The evacuation apparatus 24 is provided with a butterfly valve 31, a vacuum pump 32 and a backing vacuum pump 33. The butterfly valve 31 is disposed in the middle of a flow path which provides a communication between the bonding chamber 2 to the vacuum pump 32, and includes a rotatable disc in the main body thereof. The butterfly valve 31 is controlled by the pressure controller 22 to rotate the disc, and the opening thereof is thereby adjusted. The vacuum pump 32 is controlled by the pressure controller 22 to evacuate the gas from the bonding chamber 2 through the butterfly valve 31. Examples of the vacuum pump 32 include a turbo molecular pump, a cryopump and an oil diffusion pump. The backing vacuum pump 33 is controlled by the pressure controller 22 to evacuate the gas from the bonding chamber 2 through the butterfly valve 31. Examples of the backing vacuum pump 33 include a rotary pump and a dry pump.

The introduction gas supply apparatus 25 is provided with a gas supply source 35 and a flow adjustment valve 36. The gas supply source 35 is provided with a cylinder for storing high-pressure argon gas and controlled by the pressure controller 22 to supply the argon gas to the flow adjustment valve 36 with a constant pressure. The flow adjustment valve 36 is disposed in the middle of a flow path which communicates the gas supply source 35 to the bonding chamber 2, and provided with a mass flow controller for changing the opening of the flow path. The flow adjustment valve 36 is controlled by the pressure controller 22 to supply the argon gas to the bonding chamber 2 with a predetermined flow rate. As the flow adjustment valve 36, a valve exhibiting a faster response of the change of the opening is applied, as compared with the butterfly valve 31.

The roughing vacuum apparatus 26 is provided with a roughing vacuum valve 38 and a roughing vacuum pump 39. The roughing vacuum valve 38 is disposed in the middle of a flow path which provides a communication between the bonding chamber 2 and the roughing vacuum pump 39, and controlled by the pressure controller 22 to open and close the flow path. The roughing vacuum pump 39 is controlled by the pressure controller 22 to evacuate the gas from the bonding chamber 2 through the roughing vacuum valve 38, when the roughing vacuum valve 38 opens the flow path. Examples of the roughing vacuum pump 39 include a rotary pump and a dry pump.

The pressure controller 22 controls the opening of the butterfly valve 31 in accordance with a target pressure inputted through the input device to thereby control the evacuation speed at which the evacuation apparatus 24 evacuates the gas from the bonding chamber 2. The pressure controller 22 further measures the pressure in the bonding chamber 2 by using the pressure gauge 23 when the evacuation speed is substantially constant, and controls the supply flow rate at which the gas supply apparatus 25 supplies the introduction gas to the interior space of the bonding chamber 2 through feedback-control of the opening of the flow adjustment valve 36 in accordance with the measured pressure, so that the pressure in the bonding chamber 2 is regulated to the target pressure.

Figure 3:
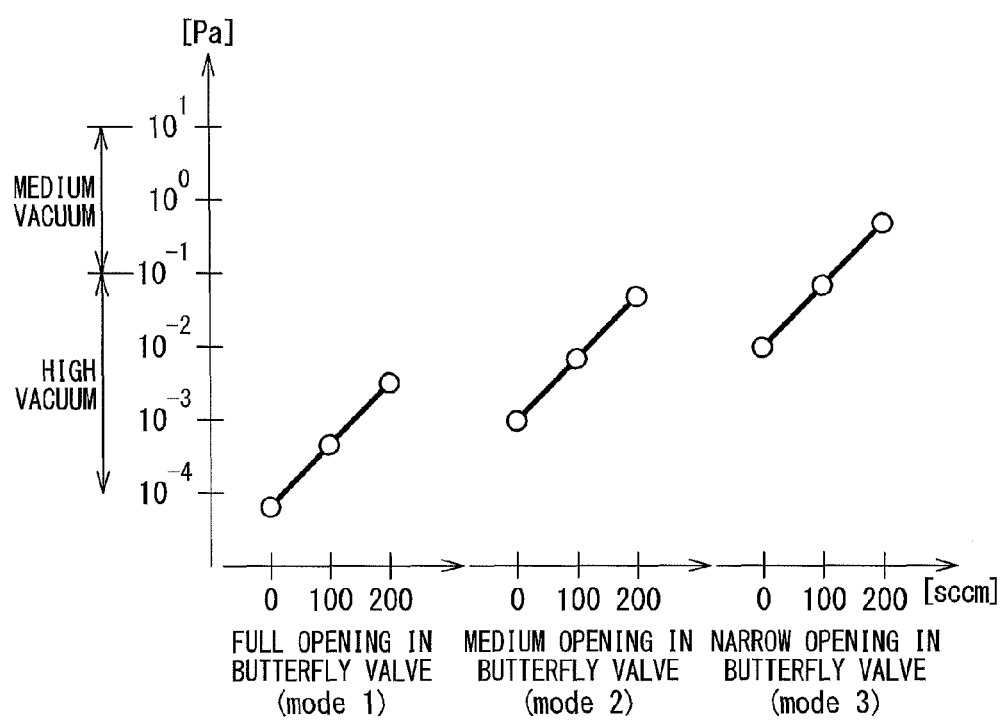
FIG. 3 is a graph showing a relation between a target pressure and the opening of a butterfly valve and a relation between the target pressure and a flow rate of a flow adjustment valve.

FIG. 3 shows a relation between the target pressure, which is inputted to the pressure controller 22, and the opening of the butterfly valve 31. The opening of the butterfly valve 31 includes four states: a full open state, a middle open state, a narrow open state and a close state. The full open state corresponds to the maximum value of the opening. The middle open state corresponds to the opening smaller than the opening corresponding to the full open state. The narrow open state corresponds to the opening smaller than the opening corresponding to the middle open state. The close state corresponds to the minimum value of the opening and means that the flow path which provides a communication between the bonding chamber 2 and the vacuum pump 32 is closed.

The allowed range of the target pressure covers a first high vacuum region, a second high vacuum region, a middle vacuum region and a low vacuum, region. The first high vacuum region means a continuous zone between the lowest pressure that can be generated by the evacuation apparatus 24 and a predetermined pressure. The second high vacuum region means a continuous zone between a certain pressure in the first high vacuum region and a pressure higher than the first high vacuum region. The middle vacuum region means a continuous zone between a certain pressure in the second high vacuum region and a pressure higher than the second high vacuum region. The upper limit of the middle vacuum region is equal to or less than the allowed maximum pressure at which evacuation by using the evacuation apparatus 24 is allowed. The low vacuum region means a range between a certain pressure in the middle vacuum region and the highest pressure that can be generated by the gas supply apparatus 25. The lower limit of the low vacuum region is equal to or less than he allowed maximum pressure at which evacuation by using the evacuation apparatus 24 is allowed. The foregoing first high vacuum region, second high vacuum region, middle vacuum region and low vacuum region are designed by the user.

That is, the pressure controller 22 controls the butterfly valve 31 so that the opening is placed into the full open state when the target pressure is included in the first high vacuum region, and controls the butterfly valve 31 so that the opening is placed into the middle open state when the target pressure is included in the second high vacuum region, and controls the butterfly valve 31 so that the opening is placed into the narrow open state when the target pressure is included in the middle vacuum region, and then controls the butterfly valve 31 so that the opening is placed into the close state when the target pressure is included in the low vacuum region.

FIG. 3 further shows the relation of a combination of the target pressure inputted to the pressure controller 22 and the opening of the butterfly valve 31, to the flow rate through the flow adjustment valve 36. The pressure p in the bonding chamber 2 is typically represented by the following equation:

$$p=Q/S,$$

where S is the evacuation speed of the evacuation apparatus 24 and Q is the supply flow rate of the gas supply apparatus 25. The relation between the target pressure and the opening of the butterfly valve 31 is calculated so that the combination of the target pressure and the opening of the butterfly valve 31 can be correlated to a range in which the flow rate through the flow adjustment valve 36 is controlled (for example, between 0 sccm and 200 sccm), on the basis of measurement results obtained by preliminarily measuring the relation between the opening of the butterfly valve 31 and the evacuation speed S of the evacuation apparatus 24.

Figure 4:
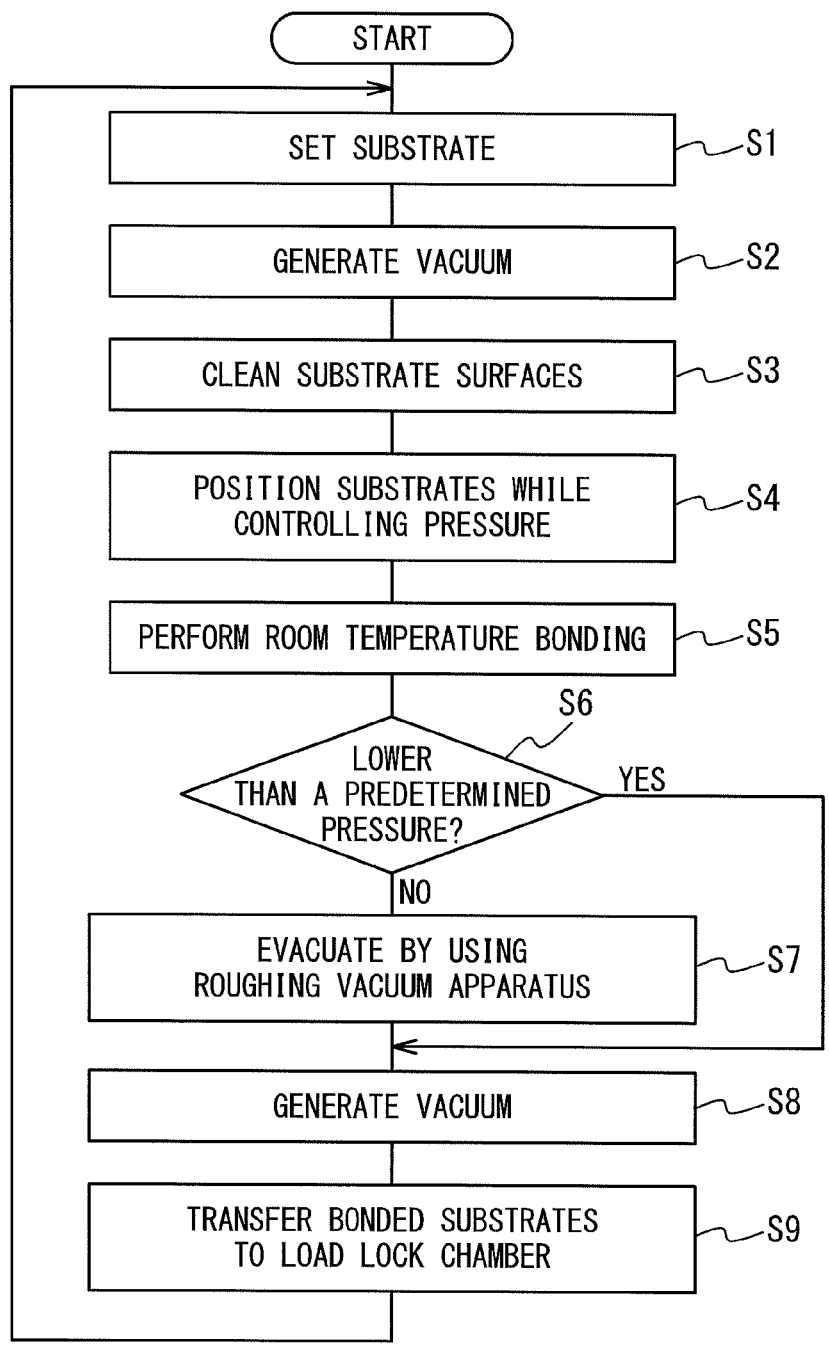
FIG. 4 is a flowchart showing an embodiment of a room temperature bonding method according to the present invention.

An embodiment of the room temperature bonding method according to the present invention is implemented by the room temperature bonding machine 1. As shown in FIG. 4, the user firstly inputs the target pressure, which indicates the pressure of the atmosphere to be sealed by the room temperature bonding, to the pressure controller 22. The user next closes the gate valve 5, generates a vacuum atmosphere in the bonding chamber 2 by using the evacuation apparatus 24, and generates an ambient pressure atmosphere in the load lock chamber 3. The user opens the cover of the load lock chamber 3 and places a plurality of substrates in the load lock chamber 3. The user closes the cover of the load lock chamber 3 and generates a vacuum atmosphere in the load lock chamber 3 by using the vacuum pump.

After opening the gate valve 5, the user places one of the substrates prepared in the load lock chamber 3 onto the upper stage 7 by using the carrying mechanism 6, and places another one of the substrates prepared in the load lock chamber 3 onto the lower stage 8 (Step S1). The user closes the gate valve 5 and generates a vacuum atmosphere in the bonding chamber 2 by using the evacuation apparatus 24 (Step S2).

The user emits particles with the ion gun 14 directed toward a space between the substrate placed on the upper stage 7 and the substrate placed on the lower stage 8, in a state in which the substrate placed on the upper stage 7 and the substrate placed on the lower stage 8 are apart from each other. The particles are emitted onto the substrates to remove oxides and the like, which are formed on the surface of the substrates, and to remove impurities deposited on the surfaces of the substrates (Step S3).

The user operates the pressing mechanism 11 to lower the upper stage 7 in the vertically downward direction so that the substrate placed on the upper stage 7 and the substrate placed on the lower stage 8 are made close to each other. The user operates the positioning mechanism 12 to move the position of the substrate placed on the lower stage 8 so that the substrate placed on the upper stage 7 and the substrate placed on the lower stage 8 are bonded at a relative position in the horizontal plane as designed. At this time, the pressure controller 22 controls the pressure gauge 23, the evacuation apparatus 24 and the introduction gas supply apparatus 25 so that the pressure in the bonding chamber 2 is regulated to the target pressure during the positioning of the substrates (Step S4).

When the positioning of the substrates is completed and the pressure in the bonding chamber 2 is stabilized to the target pressure, the user operates the pressing mechanism 11 to lower the upper stage 7 in the vertically downward direction so that the substrate placed on the upper stage 7 is placed in contact with the substrate placed on the lower stage 8. The substrate placed on the upper stage 7 and the substrate placed on the lower stage 8 are bonded upon the contact, and one bonded substrate is formed (Step S5).

The pressure controller 22 measures the pressure in the bonding chamber 2 by using the pressure gauge 23 after the room temperature bonding of the substrates is completed (Step S6). The pressure controller 22 evacuates gas from the bonding chamber 2 by using the roughing vacuum apparatus 26 when the pressure in the bonding chamber 2 is higher than the allowed maximum pressure at which evacuation by using the evacuation apparatus 24 is allowed (Step S6, NO), and thereby the pressure in the bonding chamber 2 is reduced (Step S7). The pressure controller 22 generates a vacuum atmosphere in the bonding chamber 2 by using the evacuation apparatus 24, when the pressure in the bonding chamber 2 is lower than the allowed maximum pressure (Step S8).

After the vacuum atmosphere is generated in the bonding chamber 2, the user raises the upper stage 7 in the vertically upward direction by using the pressing mechanism 11, and opens the gate valve 5. The user transports the bonded substrates placed on the lower stage 8 to the interior space of the load lock chamber 3 by using the carrying mechanism 6 (Step S9). The operations between the step S1 and the step S9 are repeatedly executed until room temperature bonding of all of the substrates initially loaded in the load lock chamber 3 is completed.

After the completion of the room temperature bonding of all of the substrates initially loaded in the load lock chamber 3, the user closes the gate valve 5 and generates the ambient pressure atmosphere in the load lock chamber 3. The user opens the cover of the load lock chamber 3 and takes the plurality of substrates bonded by the room temperature bonding away from the load lock chamber 3.

Figure 5:
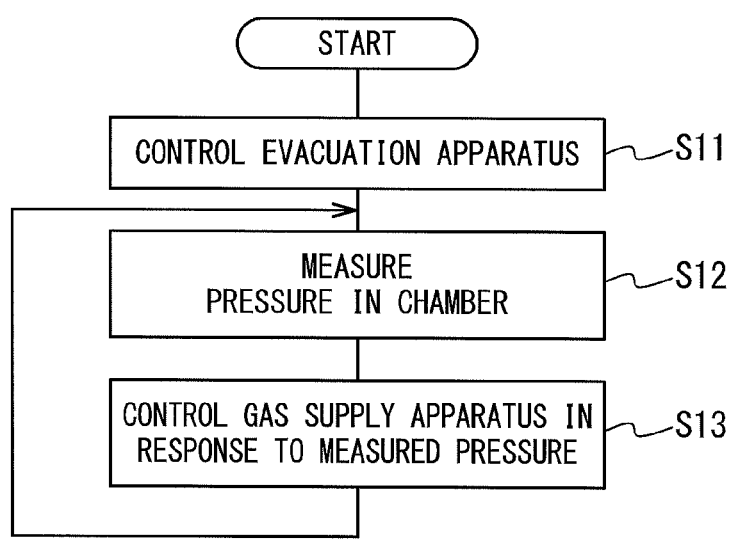
FIG. 5 is a flowchart showing a pressure control method.

FIG. 5 shows a pressure control method implemented by the pressure controller 22 at step S4. The pressure controller 22 first controls the evacuation apparatus 24 in accordance with the target pressure inputted by the user (Step S11). That is, the pressure controller 22 controls the butterfly valve 31 so that the opening is placed into the full open state when the target pressure is included in the first high vacuum region, and controls the butterfly valve 31 so that the opening is placed into the middle open state when the target pressure is included in the second high vacuum region, and controls the butterfly valve 31 so that the opening is placed into the small open state when the target pressure is included in the middle vacuum region, and then controls the butterfly valve 31 so that the opening is placed into the close state when the target pressure is included in the low vacuum region.

The pressure controller 22 measures the pressure in the bonding chamber 2 by using the pressure gauge 23 (Step S12). The pressure controller 22 performs feedback-control of the gas supply apparatus 25 in accordance with the measured pressure so that the pressure in the bonding chamber 2 is regulated to the target pressure, when the target pressure is included in the first high vacuum region or the second high vacuum region or the middle vacuum region (Step S13). Examples of the feedback control include a PI control and a PID control. That is, the pressure controller 22 repeatedly implements the operations of steps S12 and S13 at predetermined sampling periods.

The pressure controller 22 controls the gas supply apparatus 25 so that the supply of the argon gas is stopped at a timing at which the measured pressure is estimated to be identical to the target pressure, when the target pressure is included in the low vacuum region (Step S13).

According to the pressure control method thus described, the target pressure can be set over a wide range between the lowest pressure that can be generated by the evacuation apparatus 24 and the highest pressure that can be generated by the gas supply apparatus 25. The target pressure can be further set to a value higher than the ambient pressure, when the bonding chamber 2 can endure the atmosphere of the pressure equal to or higher than the ambient pressure and when the supply pressure of the argon gas supplied by the gas supply source 35 is higher than the ambient pressure.

The pressure in the bonding chamber 2 exhibits first-order lag characteristics with respect to the flow rate of the introduction gas, when the evacuation speed is substantially constant. Thus, the above-described feedback control allows the pressure control apparatus 21 to control the pressure more precisely so that the pressure in the bonding chamber 2 is sufficiently stabilized.

The room temperature bonding method to which the above-described pressure control method is applied allows setting the pressure of the atmosphere sealed by the room temperature bonding over a wide range, and controlling the pressure of the atmosphere sealed by the room temperature bonding to any value in the range. Moreover, the room temperature bonding method allows sufficiently stabilizing the pressure at the timing when the substrates are bonded by the room temperature bonding and controlling the pressure of the atmosphere sealed by the room temperature bonding precisely.

The above-described room temperature bonding method, even when the pressure in the bonding chamber 2 is higher than the allowed maximum pressure of the evacuation apparatus 24, enables reducing the pressure in the bonding chamber 2 down to a pressure lower than the allowed maximum pressure by using the roughing vacuum apparatus 26 without stopping the vacuum pump 32 in the evacuation apparatus 24 and without operating the backing vacuum pump 33 in the evacuation apparatus 24. This allows controlling the pressure in the bonding chamber 2 to the vacuum atmosphere more rapidly, and shortening the time duration necessary for each room temperature bonding.

It should be noted that the user is allowed to operate the room temperature bonding machine 1 so that the substrates are bonded by room temperature bonding while the pressure in the bonding chamber 2 is controlled by the pressure control apparatus 21. Such operation allows further stabilizing the pressure at the time when the substrates are bonded by room temperature bonding, and controlling the pressure of the atmosphere sealed by the room temperature bonding, more precisely.

It should be noted that the argon gas supplied from the gas supply apparatus 25 into the bonding chamber 2 may be replaced with introduction gas other than argon. Examples of the introduction gas include nitrogen, xenon and air. Such a replacement improves the design flexibility of the MEMS and allows the MEMS to be applied to various fields with use of various introduction gases. As for an MEMS which is formed to seal the vibration structure therein, the vibration attenuation ratio of the vibration structure disposed in the atmosphere depends on the viscosity of the gas filled in the sealed atmosphere. For example, the MEMS may incorporate a vibration structure having a vibration attenuation ratio which depends on use of various introduction gases.

Figure 6:
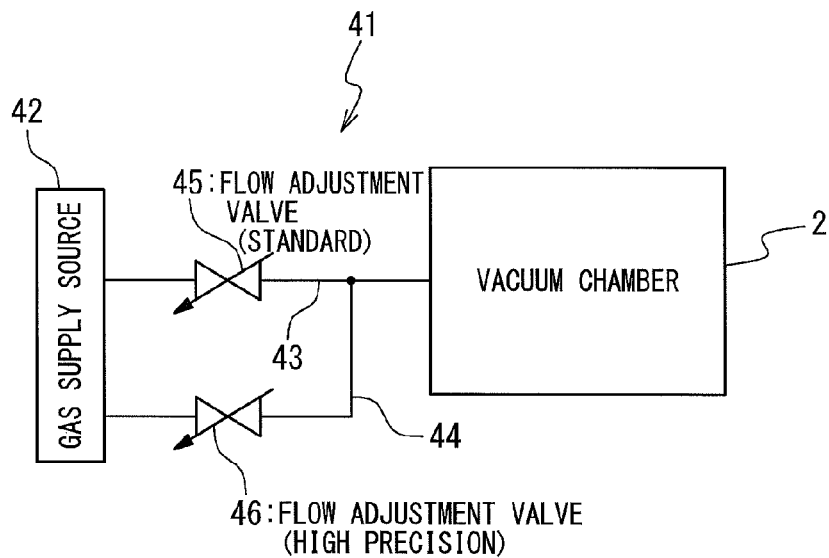
FIG. 6 is a circuit diagram showing another introduction gas supply source.

In another embodiment of the room temperature bonding machine according to the present invention, the gas supply apparatus 25 in the above-mentioned embodiment is replaced with another gas supply apparatus. The gas supply apparatus 41 contains a gas supply source 42, a flow path 43, a flow path 44, a first flow adjustment valve 45 and a second flow adjustment valve 46, as shown in FIG. 6. The flow path 43 provides a communication between the gas supply source 42 and the bonding chamber 2. The flow path 44 is provided separately from the flow path 43 and provides a communication between the gas supply source 42 and the bonding chamber 2, in parallel to the flow path 43. The gas supply apparatus 41 is controlled by the pressure controller 22 to supply argon gas with a constant pressure through the flow paths 43 and 44 to the bonding chamber 2. The flow adjustment valve 45 is arranged in the middle of the flow path 43 and controlled by the gas supply source 42 to control the flow rate with which the argon gas passes through the flow path 43. The flow adjustment valve 46 is arranged in the middle of the flow path 44 and controlled by the pressure controller 22 to control the flow rate with which the argon gas passes through the flow path 44. The flow adjustment valve 46 is designed to control the flow rate with a reduced maximum flow rate and a higher precision, as compared with the flow adjustment valve 45.

In the pressure control method implemented by the pressure control apparatus, step S13 of the pressure control method in the above-mentioned embodiment is replaced with another process. In this process, the pressure controller 22 closes the flow path 43 by using the flow adjustment valve 45, when the target pressure is included in the first high vacuum region, and provides feedback control of the flow adjustment valve 46 in response to the measured pressure so that the pressure in the bonding chamber 2 is regulated to the target pressure. When the target pressure is included in the second high vacuum region or the middle vacuum region, the pressure controller 22 closes the flow path 44 by using the flow adjustment valve 46, and provides feedback control of the flow adjustment valve 45 in accordance with the measured pressure so that the pressure in the bonding chamber 2 is regulated to the target pressure. In a case when the target pressure is included in the low vacuum region, the pressure controller 22 closes the flow path 43 by using the flow adjustment valve 45 when the difference between the measured pressure and the target pressure reaches at a predetermined value, and closes the flow path 44 by using the flow adjustment valve 46 at a timing when the measured pressure is estimated to be identical to the target pressure.

This operation, similarly to the pressure control apparatus 21 in the above-mentioned embodiment, allows the above-described pressure control apparatus to set the target pressure over a wide range and to control the pressure precisely so that the pressure in the bonding chamber 2 is sufficiently stabilized. This operation, when the target pressure is included in the first high vacuum region, allows the above-described pressure control apparatus to control the pressure more precisely, as compared with the pressure control apparatus 21 in the above-mentioned embodiment. The above-described operation, when the target pressure is included in the low vacuum region, allows the above-described pressure control apparatus to supply the argon gas to the interior of the bonding chamber 2 at a higher speed, as compared with the pressure control apparatus 21 in the above-mentioned embodiment and to control the pressure to the target pressure at the higher speed.

According to the room temperature bonding method to which the pressure control method is applied, similarly to the room temperature bonding machine 1 in the above-mentioned embodiment, the pressure of the atmosphere sealed by the room temperature bonding can be set over a wide range, and the pressure at the timing when the substrate is bonded by room temperature bonding can be sufficiently stabilized, and the pressure of the atmosphere sealed by the room temperature bonding can be controlled to any value in the range precisely. According to the room temperature bonding method, the pressure can be further controlled to the target pressure at a higher speed.

Figure 7:
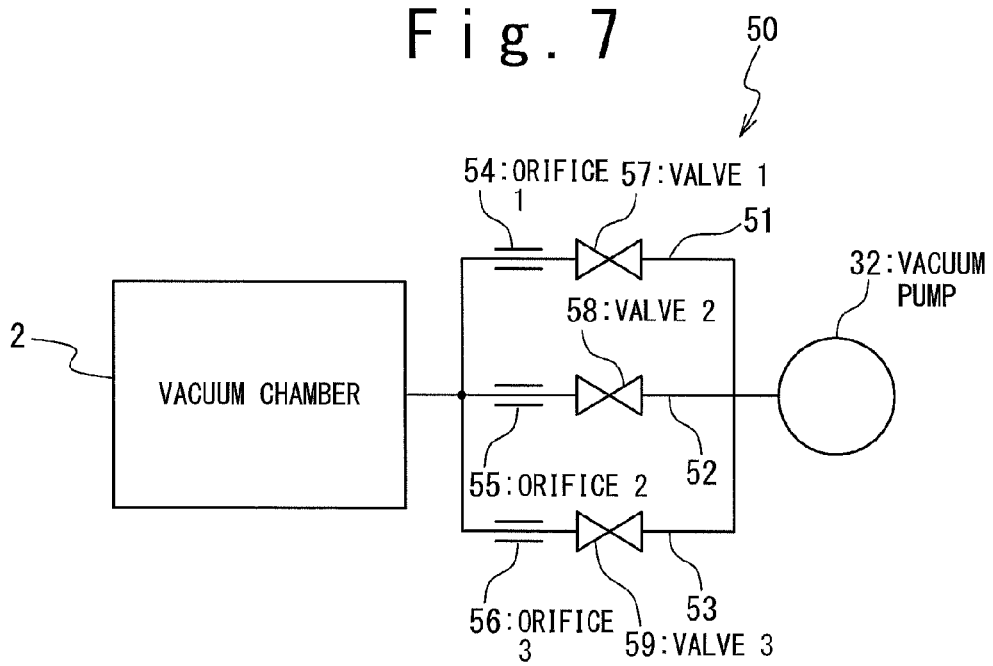
FIG. 7 is a circuit diagram showing another evacuation apparatus.

In another embodiment of the room temperature bonding machine according to the present invention, the butterfly valve 31 in the above-mentioned embodiment is replaced with another evacuation speed adjusting apparatus. The evacuation speed adjusting apparatus 50 is provided with a plurality of flow paths 51, 52 and 53, a plurality of orifices 54, 55 and 56, and a plurality of valves 57, 58 and 59, as shown in FIG. 7. The flow path 51 provides a communication between the bonding chamber 2 and the vacuum pump 32. The flow path 52 is prepared separately from the flow path 51, and provides a communication between the bonding chamber 2 and the vacuum pump 32 in parallel to the flow path 51. The flow path 53 is prepared separately from the flow paths 51 and 52, and provides a communication between the bonding chamber 2 and the vacuum pump 32 in parallel to the flow paths 51 and 52. The orifice 54 is disposed in the middle of the flow path 51. The orifice 55 is disposed in the middle of the flow path 52 and formed so that the flow rate of the gas flowing through the flow path 52 is smaller than that of the gas flowing through the flow path 51. The orifice 56 is disposed in the middle of the flow path 53 and formed so that the flow rate of the gas flowing through the flow path 53 is smaller than the flow rate of the gas flowing through the flow path 52. The valve 57 is disposed in the middle of the flow path 51 and controlled by the pressure controller 22 to open and close the flow path 51. The valve 58 is disposed in the middle of the flow path 52 and controlled by the pressure controller 22 to open and close the flow path 52. The valve 59 is disposed in the middle of the flow path 53 and controlled by the pressure controller 22 to open and close the flow path 53.

In the pressure control method implemented by the above-described pressure control apparatus, step S11 of the pressure control method in the above-mentioned embodiment is replaced with another process. In this process, the pressure controller 22 controls the valves 57 to 59 so that only the flow path 51 among the flow paths 51 to 53 is opened when the target pressure is included in the first high vacuum region, and controls the valves 57 to 59 so that only the flow path 51 among the flow paths 51 to 53 is opened when the target pressure is included in the second high vacuum region, and controls the valves 57 to 59 so that only the flow path 51 among the flow paths 51 to 53 is opened when the target pressure is included in the middle vacuum region, and controls the valves 57 to 59 so that all of the flow paths 51 to 53 are closed when the target pressure is included in the low vacuum region.

The evacuation speed adjusting apparatus 50 is advantageous in terms of easy control and reduced manufacture cost, as compared with the butterfly valve 31 in the above-mentioned embodiment. Moreover, the above-described operation, similarly to the pressure control apparatus 21 in the above-mentioned embodiment, allows the pressure control apparatus to set the target pressure over a wide range and to control the pressure precisely so that the pressure in the bonding chamber 2 is sufficiently stabilized. It should be noted that the evacuation speed adjusting apparatus 50 may be controlled so that the number of the opened flow path(s) among the flow paths 51 to 53 is changed. Such operation also allows setting the target pressure over a wide range, and controlling the pressure precisely so that the pressure in the bonding chamber 2 is sufficiently stabilized.

According to the room temperature bonding method to which the above-described pressure control method is applied, similarly to the room temperature bonding machine 1 in the above-mentioned embodiment, the pressure of the atmosphere sealed by the room temperature bonding can be set over a wide range, and the pressure at the timing when the substrates are bonded by room temperature bonding can be sufficiently stabilized, and the pressure of the atmosphere sealed by the room temperature bonding can be controlled to any value in the range precisely.

It should be noted that the evacuation apparatus 24 may be designed to regulate the evacuation speed by controlling the vacuum pump 32. When the vacuum pump 32 is the turbo molecular pump, for example, the pressure controller 22 may control the evacuation speed of the evacuation apparatus 24 by changing the number of rotations. This control, although making the response slower as compared with the pressure control method in the above-mentioned embodiment, allows setting the target pressure over a wide range and controlling the pressure precisely so that the pressure in the bonding chamber 2 is sufficiently stabilized, as is the case of the pressure control method in the above-mentioned embodiments.

The present invention claims a priority based on Japan Patent Application No. 2008-002102, filed on Jan. 9, 2008, and the disclosure of which is incorporated herein in its entirety by reference.

The invention claimed is:

1. A room temperature bonding machine, comprising:
an evacuation apparatus evacuating gas from a chamber;
a gas supply apparatus supplying introduction gas into said chamber;
a pressure gauge measuring a pressure in said chamber;
a cleaner apparatus cleaning first and second substrates in said chamber when said pressure is at a predetermined degree of vacuum;
a pressure controller controlling both of said evacuation apparatus and said gas supply apparatus so that said pressure is regulated to a target pressure;
a pressing mechanism pressing and bonding said first and second substrates when said pressure is set to said target pressure; and
a roughing vacuum apparatus provided separately from said evacuation apparatus to evacuate gas from said chamber, said evacuation apparatus and said roughing vacuum apparatus being provided parallel with respect to said chamber,
wherein said evacuation apparatus includes:
a flow path providing a communication between an interior space of said chamber and a vacuum pump; and
a valve controlling an opening of said flow path,
wherein said gas supply apparatus includes at least one flow rate adjustment valve controlling a flow rate of gas flowing through a supply-side flow path providing a communication between an introduction gas supply source and the interior of said chamber,
wherein said pressure controller controls an evacuation speed at which said evacuation apparatus evacuates the gas from said chamber, based on said target pressure by controlling said opening, and controls a supply flow rate at which said gas supply apparatus supply the introduction gas into said chamber, based on said pressure, by controlling said at least one flow rate adjustment valve, so that said pressure is regulated to said target pressure,
wherein, when said target pressure is set higher than an allowed maximum pressure of said evacuation apparatus, said pressure controller controls said gas supply apparatus to supply said introduction gas in a state in which gas is not evacuated from said chamber by using said evacuation apparatus, and to stop the supply of said introduction gas at a timing when said pressure is increased up to said set target pressure,
wherein said pressure controller controls said roughing vacuum apparatus to evacuate gas from said chamber, when said set target pressure is higher than the allowed maximum pressure of said evacuation apparatus after said first and second substrates are bonded, and
wherein said pressure controller controls said evacuation apparatus to evacuate gas from said chamber after said pressure is reduced below said allowed maximum pressure by evacuation of gas from said chamber by said roughing vacuum apparatus.

2. The room temperature bonding machine according to claim 1, wherein said evacuation apparatus includes a plurality of valves for opening and closing respective flow paths which provide parallel communications between an interior space of said chamber and a vacuum pump, and
wherein said pressure controller controls said evacuation speed by controlling said plurality of valves.

3. The room temperature bonding machine according to claim 1, wherein said at least one flow rate adjustment valve includes:
a first flow rate adjustment valve controlling a first flow rate of gas flowing through a first supply-side flow path providing a communication between said introduction gas supply source and the interior space of said chamber; and
a second flow rate adjustment valve controlling a second flow rate of gas flowing through a second supply-side flow path providing a communication between said introduction gas supply source and the interior space of said chamber, more precisely than said flow rate adjustment valve,
wherein, when said target pressure is lower than a predetermined pressure, said pressure controller controls said second flow rate adjustment valve based on said pressure in a state in which said first supply-side flow path closed by using said first flow rate adjustment valve, and
wherein, when said target pressure is higher than the predetermined pressure, said pressure controller controls said first flow rate adjustment valve based on said pressure in a state in which said second supply-side flow path closed by using said second flow rate adjustment valve.

4. The room temperature bonding machine according to claim 1, wherein regulation of said pressure to said target pressure by said gas supply apparatus is implemented simultaneously with an operation of positioning said first and second substrates after cleaning of said first and second substrates.

* * * * *